United States Patent [19]

Mukai

[11] Patent Number: 5,291,375
[45] Date of Patent: Mar. 1, 1994

[54] PRINTED CIRCUIT BOARD AND ELECTRIC DEVICE CONFIGURED TO FACILITATE BONDING

[75] Inventor: Minoru Mukai, Tokyo, Japan

[73] Assignee: Kabushiki Kaisha Toshiba, Kanagawa, Japan

[21] Appl. No.: 953,043

[22] Filed: Sep. 29, 1992

[30] Foreign Application Priority Data

Sep. 30, 1991 [JP] Japan ............................. 3-250073
Mar. 30, 1992 [JP] Japan ............................. 4-102380

[51] Int. Cl.⁵ .................................................. H05K 7/02
[52] U.S. Cl. ................................ 361/760; 361/761;
361/767; 361/808; 361/813; 174/259; 174/260;
257/692; 257/697
[58] Field of Search ............ 361/380, 397, 395, 400,
361/401, 406, 403, 408, 411, 418, 421, 760, 761,
767, 770, 776, 808, 813; 174/259, 260, 261, 263;
257/692, 693, 694, 695, 696, 697

[56] References Cited

U.S. PATENT DOCUMENTS 5,093,282 3/1992 Ohno ................................ 437/221

FOREIGN PATENT DOCUMENTS 2-292807 12/1990 Japan .
3-104148 5/1991 Japan .
3-148165 6/1991 Japan .

OTHER PUBLICATIONS

IBM I Disclosure Bulletin, vol. 34, Aug. 1991, Integrated test via and pad design, pp. 361–362, No. 3.
IBM II Technical Disclosure Bulletin, Flexible film chip carrier with fine line capabilities, Sep. 1991, vol. 34, No. 4B, pp. 389–390.

Primary Examiner—Leo P. Picard
Assistant Examiner—Young Whang
Attorney, Agent, or Firm—Finnegan, Henderson, Farabow, Garrett & Dunner

[57] ABSTRACT

A circuit board for mounting an electric device having a plurality of leads, the circuit board including an insulating substrate and a pad electrode formed on the insulating substrate, the pad electrode including an upper portion and a lower portion, and the lower being configured to be bonded to a lead portion. Also, an electric device mounted on a circuit board which has a plurality of pad electrodes each having a surface contacting the circuit board, the electric device including a package having a semiconductor device and a plurality of leads each having one end portion which is bonded to a corresponding pad electrode among the plurality of pad electrodes, at least three of the leads being longer than other ones of the leads, a bonding material filling a gap between each of the other leads and its corresponding pad electrode.

27 Claims, 6 Drawing Sheets

PRINTED CIRCUIT BOARD AND ELECTRIC DEVICE CONFIGURED TO FACILITATE BONDING

BACKGROUND OF THE INVENTION

1. Field of the Invention

The present invention relates to a printed circuit board and an electric device suitable for mounting on a printed circuit board. More particularly, the present invention relates to improvements in the configuration of pad electrodes on a printed circuit board and the shape of leads found in IC (integrated circuit) packages such as LSI (large scale integration) packages.

2. Description of the Related Art

Recently, industrial machines and tools, computers, and the like have been required to be smaller and perform more advanced or complicated functions. Accompanied with this situation, current electric devices (such as semiconductor devices) are manufactured to be small and integrated. The printed circuit boards on which such electric devices are to be mounted are often required to be correspondingly small in size.

FIG. 1 shows a partial sectional view of a conventional printed circuit board 300. Printed circuit board 300 comprises an insulating board 302 and circuit patterns 304 composed of conductive (e.g., copper) films formed on the insulating board. Circuit patterns 304 include a plurality of land portions, i.e., pad electrodes. An electric device 306, such as a semiconductor device, is mounted on printed circuit board 300. Electric device 306 has a plurality of leads which are soldered to corresponding pad electrodes of circuit patterns 304, respectively. One of the leads, designated by the reference numeral 308, and its respective pad electrode 310, are shown in FIG. 1.

As shown in FIG. 1, a surface 312 of pad electrode 310 is soldered together with one end portion 314 of lead 308. Surface 312 is parallel to the upper surface of insulating board 302, such that pad electrode 310 has a uniform thickness. Soldered surface 312 is in contact with end portion 314 and bonded to lead 308 by solder material 316.

According to the conventional technology described above, the amount of solder material disposed between soldered surface 312 of pad electrode 310 and end portion 314 of lead 308 is very small. This is because semiconductor devices are currently manufactured to be integrated and minute with narrow lead widths, and the end portion 314 of leads in such devices is parallel to the surface of insulating board 302. Due to the small amount of solder material present between surface 312 and end portion 314, a sufficient lead pull strength between lead 308 and pad electrode 310 cannot be fully attained.

The foregoing problem seriously affects the performance and manufacturing of devices such as the Quad Flat Package (QFP) type semiconductor device 400 illustrated in FIGS. 2(a) and 2(b). These figures show a plan view and a partial side view of QFP type semiconductor device 400, respectively. As is apparent from FIGS. 2(a) and 2(b), the sectional size of each lead 402 of QFP semiconductor device 400 is small, such as 0.2 mm×0.2 mm or 0.1 mm×0.2 mm, and the spacings between such leads are narrow in dimension (e.g., 0.4 mm to 0.5 mm).

FIG. 2(b) illustrates that QFP type semiconductor device 400 is mounted on a printed circuit board 408. With reference to FIG. 2(b), it is difficult to ensure that a fillet portion of solder material 404 will be formed at an edge portion of lead 402 such that the lead will be securely bonded to pad electrode 406.

As is apparent from FIG. 2(a), the leads 402 of QFP type semiconductor device 400 are not always properly bonded to their respective pad electrodes 406 due to, for example, various errors in the manufacturing process and the like. As a result, a relative alignment error between each lead 402 and its respective pad electrode 406 occurs, and a lead pull strength between each lead 402 of QFP type semiconductor device 400 and printed circuit board 408 is largely decreased. Reference numeral 402a of FIG. 2(b) is representative of a lead that is not securely bonded to its respective pad electrode.

Japanese Patent Disclosure (Kokai) No. 3-104148 describes a method to improve a lead pull strength by forming a step portion in one end portion of a lead. This document contends that by forming a step portion in one end portion of a lead, a soldered portion having a greater thickness can be formed and the lead pull strength between a lead and a land portion of a printed circuit board can be improved.

The method of this document is deficient, however, in that it requires the formation of a step portion in each lead, thereby complicating the manufacturing process. The manufacturing process becomes even more difficult when the number of leads being fabricated is increased or when leads having minimized dimensions are being fabricated. A further deficiency associated with this method is that it cannot sufficiently resolve the above-described problem resulting from relative alignment error.

The above-described problem resulting from relative alignment error is also observed in a Pin Grid Array (PGA) type semiconductor device 500, as illustrated in FIGS. 3(a), 3(b), and 3(c). These figures show, respectively, a side view and a plan view of PGA type semiconductor device 500, and a partial magnified side view of soldered portions of leads extending out from the device.

PGA type semiconductor device 500 has a plurality of lead pins 502, which are regularly arrayed in a lattice located at the bottom surface of its body. The configuration of each lead pin 502, and the length of such lead pins, are the same. Each lead pin 502 is mounted so as to contact with a respective pad electrode 504 formed on a printed circuit board 506.

According to the structure shown in FIG. 3(c), a relative alignment error between each lead pin 502 and its respective pad electrode 504 occurs because the accuracy of forming lead pins 502 or pad electrodes 504 at pre-designed sizes, and the alignment of each lead pin 502 and its respective pad electrode 504, are subject to deterioration an accompanied by effects resulting from the fabrication of lead pins which are small or minute. Due to the foregoing factors, it is difficult to properly carry out the soldering of each lead pin 502 to its respective pad electrode 504. Accordingly, the lead pull strength between such lead pins and their corresponding pad electrodes is largely decreased.

In light of the foregoing problems, a new method which minimizes or eliminates deterioration of the lead pull strength, without requiring complex manufacturing techniques, is desired.

SUMMARY OF THE INVENTION

One object of the invention is to provide a circuit board having pad electrodes, and/or an electric device having leads and being mounted on a circuit board, with a high lead pull strength existing between each pad electrode and its corresponding lead.

To attain the aforementioned object of the invention, there is provided a circuit board for mounting an electric device having a plurality of leads, the circuit board comprising an insulating substrate and a pad electrode which is formed on the insulating substrate, the pad electrode including an upper portion and a lower portion, and the lower portion being configured to be bonded to a lead.

Furthermore, to attain the aforementioned object of the invention, there is also provided a circuit board for mounting an electric device which comprises a package, a semiconductor device being provided in the package and a plurality of leads each having one end portion extending out from the package, the circuit board comprising an insulating substrate and a pad electrode formed on the insulating substrate and having a thinner portion and a thicker portion, wherein a portion of a lead is bonded to the thicker portion to thereby form a gap, filled with bonding material, between the thinner portion of the pad electrode and one end portion of the lead.

Additionally, to attain the aforementioned object of the invention, there is also provided a circuit board, for mounting an electric device which comprises a package, a semiconductor chip being provided in the package and a plurality of leads each having one end portion coming out from the package, the circuit board comprising an insulating substrate and a plurality of pad electrodes formed on the substrate, at least one lead being mounted on a corresponding electrode among the plurality of pad electrodes to thereby form a gap, filled with solder, between the lead and the corresponding electrode.

Also, to attain the aforementioned object of the invention, there is provided an electric device mounted on a circuit board which has a plurality of pad electrodes each having a surface contacting the circuit board, the electric device comprising a package including a semiconductor device, and a plurality of leads each having one end portion which is bonded to a corresponding pad electrode among the plurality of pad electrodes, at least three of the leads being longer than other ones of the leads, and a bonding material filling a gap formed between each of the other leads and its corresponding pad electrode.

BRIEF DESCRIPTION OF THE DRAWINGS

Other objects and advantages of the invention will be apparent from the following description, taken in conjunction with the accompanying drawings, in which.

DETAILED DESCRIPTION OF THE PREFERRED EMBODIMENTS

A first embodiment of the invention is described with reference to FIGS. 4 and 5. These figures are a perspective view and a sectional view of the first embodiment, respectively.

Figure 4:
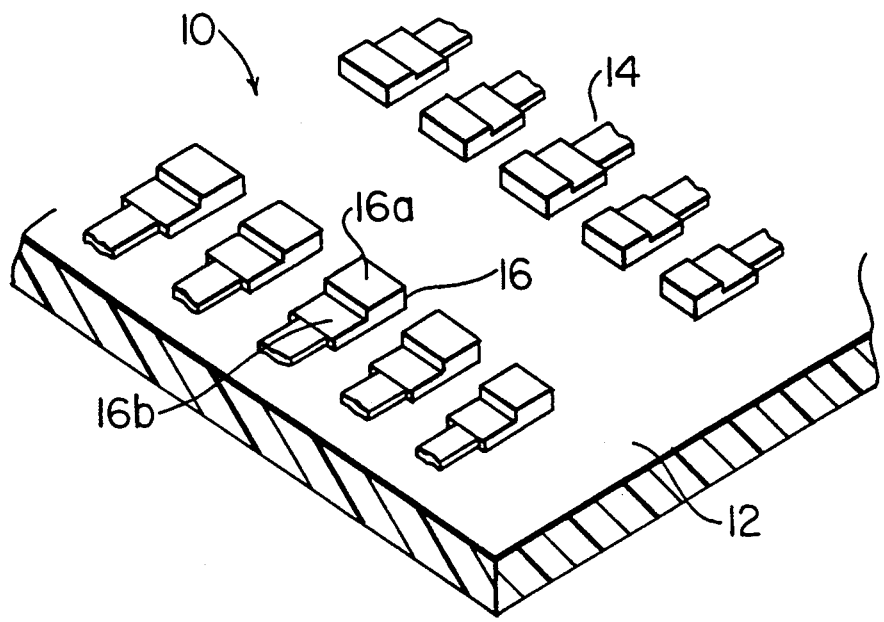
FIG. 4 is a partial plan view of a printed circuit board in accordance with a first embodiment of the invention.

A printed circuit board 10, as shown in FIG. 4, comprises an insulating substrate 12 made of material such as phenol resin or epoxy resin, and one or more circuit patterns 14 formed thereon. Circuit patterns 14 are formed by patterning or depositing a conductive film, such as copper film, on substrate 12.

Circuit patterns 14 include one or more pad electrodes 16. As shown in FIG. 5, each pad electrode 16 is configured to function as a base upon which a corresponding lead 18 of an electric device 22 (such as a semiconductor device) may be mounted. Each end portion of each lead 18 is stably bonded to its respective pad electrode 16 using solder material 20, as shown in FIG. 5.

The solder-receiving surface of each pad electrode 16 comprises an upper surface 16a and a lower surface 16b, with lower surface 16b being aligned with an edge portion 18a of its respective lead 18.

The method that is used to form the pad electrodes having surfaces of different heights is easily carried out by known etching methods such as mechanical etching, wet etching, or reactive ion etching (RIE). In each of these methods, a pad electrode 16 having a substantially uniform height corresponding to the height of upper surface 16a is formed, and a portion of the pad electrode is etched to form lower surface 16b. Another method by which the pad electrodes can be fabricated involves the formation of a pad electrode 16 having a substantially uniform height corresponding to the height of lower surface 16b, and the subsequent formation of an electrode (e.g., a copper layer or electroless plating of copper) on the pad electrode at a location corresponding to upper surface 16b.

Figure 5:
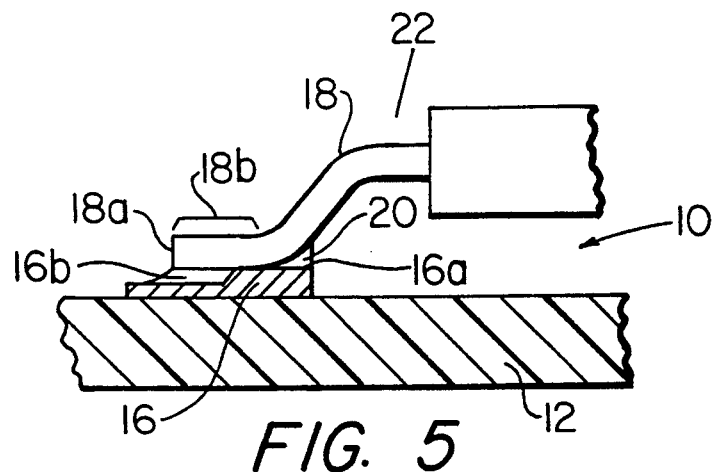
FIG. 5 is a partial sectional view of the circuit board shown in FIG. 4.

A surface mounting process used to attain the structure shown in FIG. 5 is described below.

With reference to FIG. 5, prior to the surface mounting of semiconductor device 22 on printed circuit board 10, a thin solder film is applied to the solder-receiving surface of pad electrode 16, and then the semiconductor device is placed in a position for bonding to a desired portion of circuit patterns 14. At this time, each lead 18 of semiconductor device 22 is placed on the solder-receiving surface of its respective pad electrode 16. More particularly, at this time, part of each lead 18 is placed on the upper surface 16a of its respective pad electrode through the solder material 20, such that an edge portion 18a of lead 18 is aligned with lower surface 16b.

In the structure described above, a gap corresponding in dimension to the difference in height between lower surface 16b and upper surface 16a is formed between end portion 18b of lead 18 and lower surface 16b of pad electrode 16. The dimension of the gap is, for example, one-half (½) to one-third (⅓) the height of lead 18. The end portion 18b of each lead 18 is soldered to its respective pad electrode 16 in this state by melting solder material 20. When solder material 20 is melted, the gap between end portion 18b of lead 18 and lower surface 16b of pad electrode 16 is fully filled with solder material 20.

According to the foregoing structure, even if the width of lead 18 is narrow, a fillet portion of solder material 20 is formed at edge portion 18a of the lead. As a result, a strong bond is formed between lead 18 and pad electrode 16. Also, according to such structure, even if the distances between the leads are narrow, solder bridges or electrical shorts between adjacent ones of leads 18 are hardly ever formed. Accordingly, the end portion 18b of lead 18 and the solder-receiving surfaces of pad electrode 16 are soldered together by a proper amount (e.g., an increased amount) of solder material when the above structure is used.

In accordance with the first embodiment of the invention, it is possible to absorb thermal stress generated in a direction parallel to the end portion 18b of lead 18 when the electric device from which the lead extends is in operation. Such thermal stress is generally based on a difference of materials (e.g., the difference between the materials which form lead 18 and substrate 12). However, according to the first embodiment, it is possible to reduce shearing stress of lead 18 per a certain thickness. Also, in accordance with the first embodiment, electric device 22 can be mounted on printed circuit board 10 with high mechanical reliability. The miniaturization of computers or other types of machines at high performance standards may be realized, therefore, through use of one or more electric devices mounted on a circuit board in accordance with the first embodiment.

Figure 6:
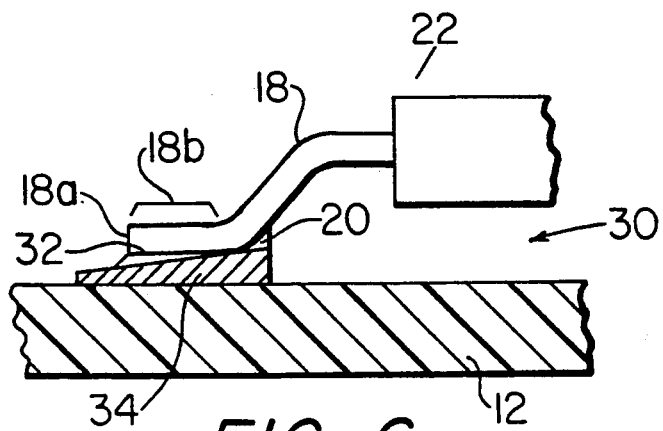
FIG. 6 is a partial sectional view of a first modification of a circuit board in accordance with the first embodiment.

A first modification of the first embodiment of the invention is described with reference to FIG. 6, which is a partial sectional view of a printed circuit board 30 and an electric device 22. Aside from the configuration of pad electrode 34 on printed circuit board 30, the structure shown in FIG. 6 is essentially the same as the structure of the first embodiment illustrated in FIG. 5. The same reference numerals are therefore used to designate like parts in FIGS. 5 and 6, and the characteristics of those parts shown in FIG. 6 which have been discussed previously may be understood from the description of FIG. 5 above.

The first modification, shown in FIG. 6, is characterized in that pad electrode 34 has a solder-receiving surface 32 which is gradually inclined, such that the height of the solder-receiving surface is lower toward the end portion 18b of lead 18 in order to form a solder-receiving surface having a gradual slope. In the modification shown in FIG. 6, electric device 22 is mounted on printed circuit board 30 in a manner similar to the first embodiment. In other words, a thin film of solder material is formed on the solder-receiving surface 32 of pad electrode 34, and then electric device 22 is placed at a certain position. More particularly, a plurality of leads 18 are positioned such that the end portion 18b of each lead 18 is aligned with its respective pad electrode 34. It is important to note that the part of the end portion 18b of each lead 18 near the package of electric device 22 contacts a higher portion of the inclined solder-receiving surface 32 of pad electrode 34, and lead edge portion 18a is positioned at a lower portion of the inclined solder-receiving surface 32. Accordingly, a wedge-shaped gap is formed between the end portion 18b of each lead 18 and the solder-receiving surface 32 of its respective pad electrode 34, and these elements are connected to one another using melted solder material 20. As a result, the wedge-shaped gap is fully filled with solder material 20 and a fillet portion is formed at the lead edge portion 18a such that the end portion 18b of lead 18 and solder-receiving surface 32 of pad electrode 16 are effectively soldered together by use of a proper amount (e.g., an increased amount) of solder material 20.

According to the first modification of the first embodiment, advantages similar to those associated with the first embodiment, shown in FIG. 5, can be obtained. Additionally, in the first modification, solder-receiving surface 32 of pad electrode 34 does not have any step in its surface, so that a thin solder material film, as compared with that used in the first embodiment, may be more easily formed.

Figure 7:
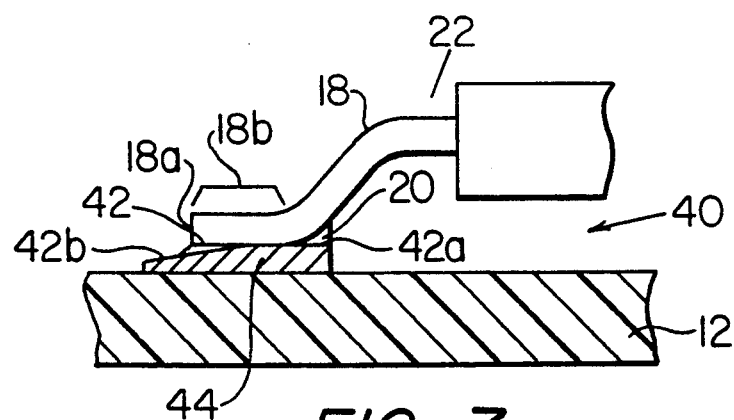
FIG. 7 is a partial sectional view of a second modification of a circuit board in accordance with the first embodiment.

A second modification of the first embodiment of the invention is described with reference to FIG. 7, which is a partial sectional view of a printed circuit board 40 and an electric device 22. Aside from the configuration of the pad electrode 44 on printed circuit board 40, the structure shown in FIG. 7 is essentially the same as the structure of the first embodiment illustrated in FIG. 5. The same reference numerals are therefore used to designate like parts in FIGS. 5 and 7, and the characteristics of those parts shown in FIG. 7 which have been discussed previously may be understood from the description of FIG. 5 above.

In the second modification, pad electrode 44 has a solder-receiving surface 42 including an upper plane portion 42a that is parallel to printed circuit board 40 at a position near the package side of electric device 22. Solder-receiving surface 42 of pad electrode 44 also has a lower portion 42b that is inclined such that its height becomes lower as it progresses to the edge portion 18a of lead 18 from upper plane portion 42a.

A surface mounting process in the second modification of the first embodiment can be carried out in a manner similar to surface mounting in the first modification. However, according to the second modification, lead 18 can be in contact with a greater proportion of upper plane portion 42a than in the first modification, thereby facilitating the soldering of lead 18 against pad electrode 44. In accordance with the second modification of the first embodiment, advantages similar to those achieved by the first modification of the first embodiment, as shown in FIG. 5 and described above, can be obtained.

Similar to the first embodiment of FIG. 5, the configuration of pad electrodes 34 and 44 in FIG. 6 and FIG. 7, respectively, can be attained using known etching methods such as mechanical etching, wet etching, or reactive ion etching.

An important aspect in the relationship between the upper portion and the lower portion is that when a lead is placed at the upper portion, a gap is formed between the lead and the lower portion. Accordingly, it is possible to use other structure of the pad electrode to satisfy the relationship. For example, a pad electrode having the slope of the lower portion greater than that of the upper portion may be used.

Figure 8A:
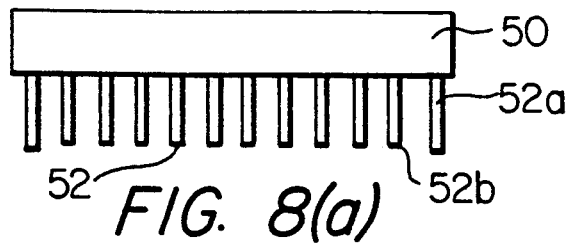
FIGS. 8(a) and 8(b) are, respectively, a side view and a plan view of a PGA type semiconductor device in accordance with a second embodiment of the invention.
Figure 8B:
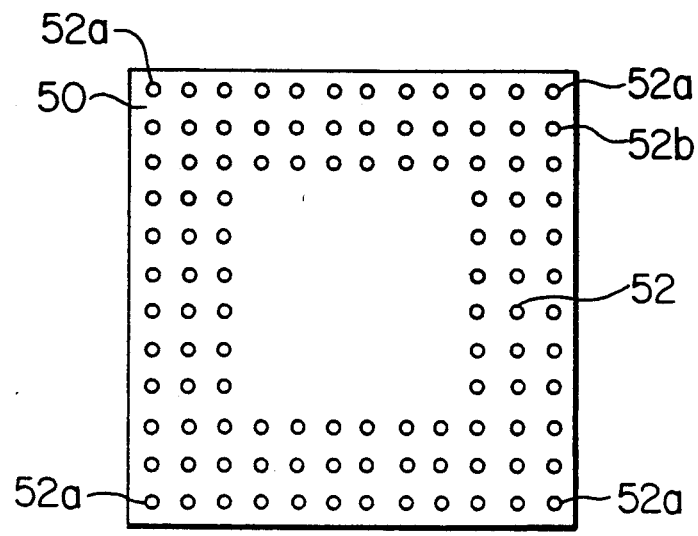

A second embodiment of the invention is described with reference to FIGS. 8(a), 8(b), and 8(c). FIG. 8(a) is a side view of a PGA type semiconductor device 50 for use as an electric device. FIG. 8(b) is a plan view of the device shown in FIG. 8(a), and FIG. 8(c) is a partial magnified side view of the leads extending out from the PGA semiconductor device shown in FIGS. 8(a) and 8(b).

As shown in FIGS. 8(a) and 8(b), PGA type semiconductor device 50 has a plurality of pin leads 52 extending from its bottom portion. Pin leads 52 are regularly arrayed in a lattice on the bottom surface of semiconductor device 50. The length of each of the four pin leads provided at the four corners of the bottom surface is slightly longer (e.g., several tens of $\mu m$) than the non-corner leads. For example, the corner leads may be 20 or 30 $\mu m$ longer than the non-corner leads.

Figure 8C:
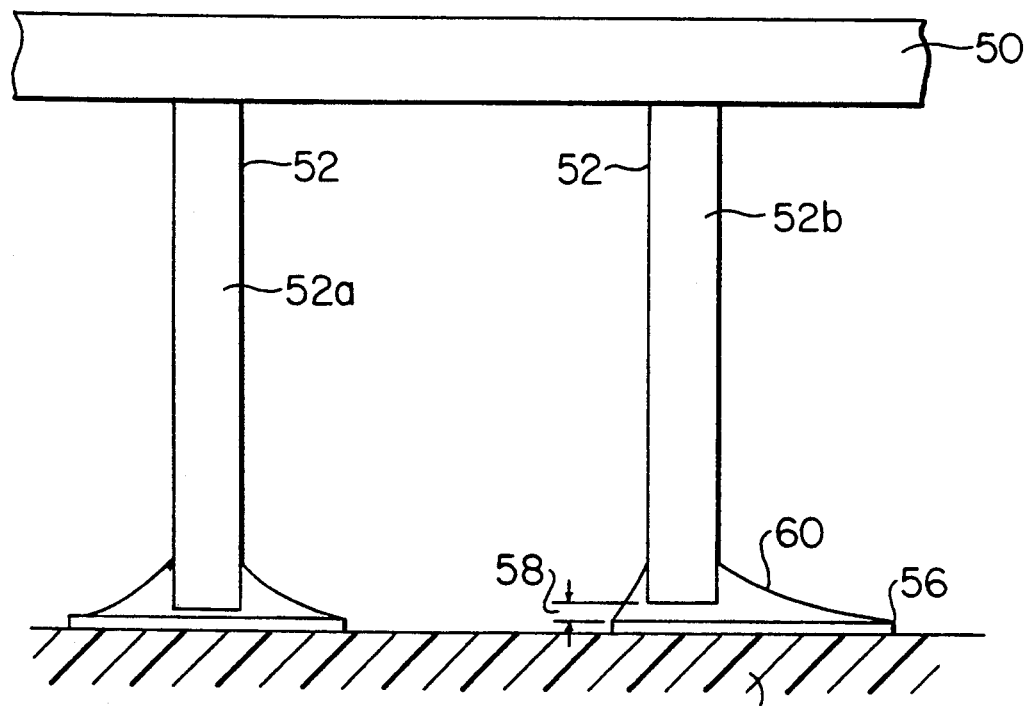
FIG. 8(c) is a partial magnified side view of leads extending out from the PGA semiconductor device shown in FIGS. 8(a) and 8(b).

As shown in FIG. 8(c), a printed circuit board 54 upon which PGA type semiconductor 50 is mounted does not have any holes into which pin leads 52 may be inserted. As a result, PGA type semiconductor device 50 is mounted by placing and soldering leads 52 on a plurality of electrodes 56, respectively, provided on the upper surface of printed circuit board 54. In this manner, PGA type semiconductor device 50 is held in a stable state at a determined position with respect to electrodes 56 of printed circuit board 54 by longer leads 52a provided at the four corners of the printed circuit board.

As shown in FIG. 8(c), a constant gap 58 (e.g., a gap of several tens of $\mu m$, such as 20 or 30 $\mu m$) is formed between an edge of each non-corner lead 52b and its respective electrode 56 on printed circuit board 54 because the non-corner leads are shorter than corner leads 52a.

In the aforementioned surface mounting structure, as is apparent from FIG. 8(c), the gap 58 between each shorter non-corner lead 52b and its respective electrode 56 is sufficiently filled with solder material 60. Accordingly, even if a relative alignment error between an axial center of a non-corner lead 52b and a plane center of its respective electrode 56 exists, a lead pull strength of the soldered portion can be increased by using a proper amount (e.g., an increased amount) of solder material 60.

Figure 1:
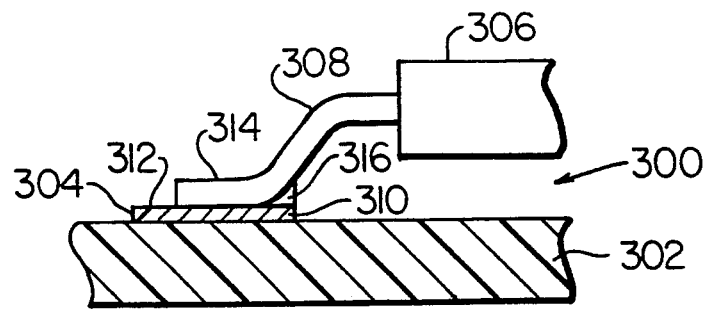
FIG. 1 is a sectional view of a conventional printed circuit board on which an electric device is mounted.
Figure 2A:
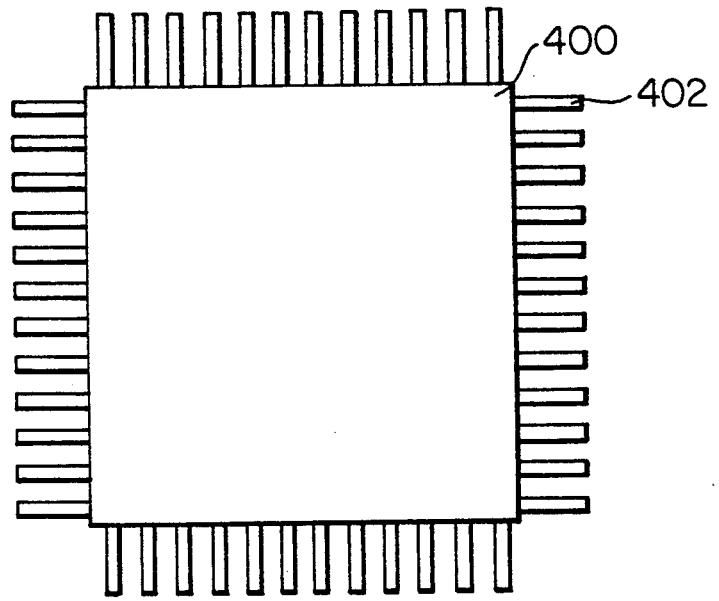
FIGS. 2(a) and 2(b) are a plan view and a partial side view of a conventional QFP type semiconductor device, respectively.
Figure 2B:
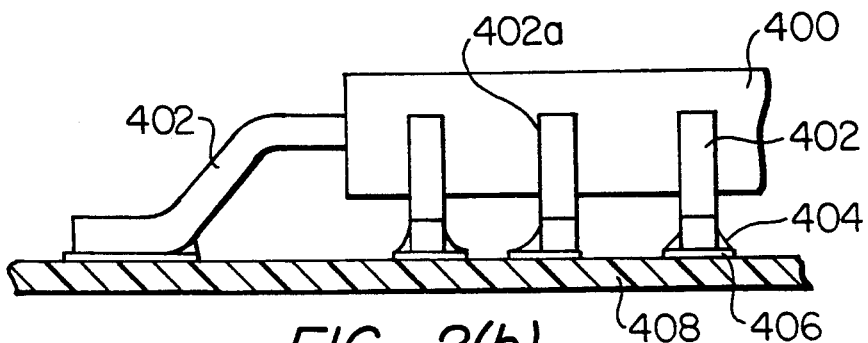
Figure 3A:
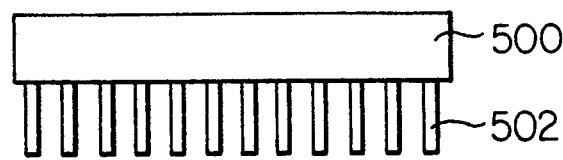
FIGS. 3(a) and 3(b) are a side view and a plan view of a conventional PGA type semiconductor device, respectively.
Figure 3B:
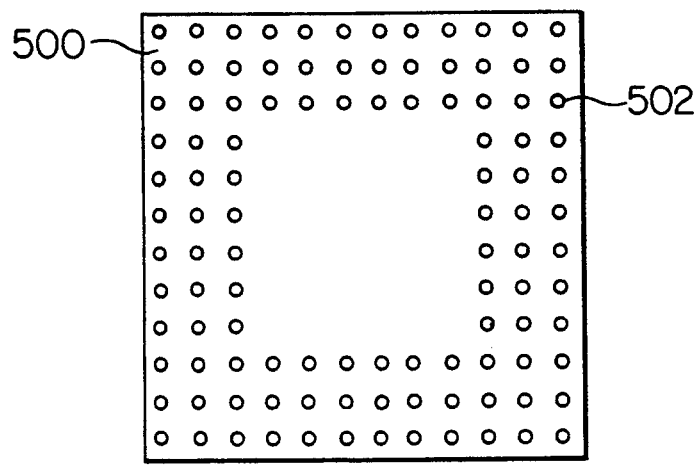
Figure 3C:
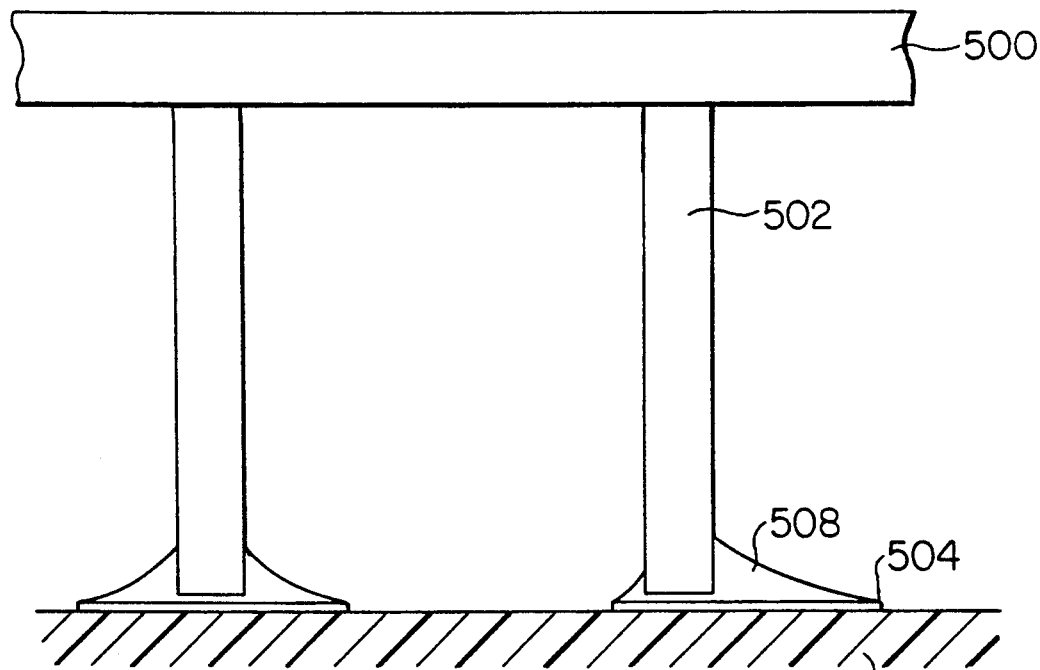
FIG. 3(c) is a partial magnified side view of leads extending out from the PGA type semiconductor device shown in FIGS. 3(a) and 3(b).

In the manufacturing of the PGA type semiconductor device in accordance with the second embodiment, four corner leads 52a, which are longer than non-corner leads 52b, are simply placed at the four corners of the leads 52 arrayed in a lattice. Thus, other than ensuring that the leads 52 are of different heights, the process of manufacturing PGA type semiconductor device 50 is similar to the process of forming the semiconductor device shown in FIGS. 3(a)-3(c). It should be noted that longer leads 52a, instead of occupying the four corners, could alternatively be provided at two corners of the lattice and at a location midway through a side of the lattice opposite the two corners, so that only three, instead of four, longer leads 52a would be required. Other configurations, of course, could also be used.

A third embodiment of the invention, applicable to QFP type semiconductor devices, is described with reference to FIGS. 9(a) and 9(b), which are a plan view and a partial magnified side view of a QFP type semiconductor device 70, respectively.

Figure 9A:
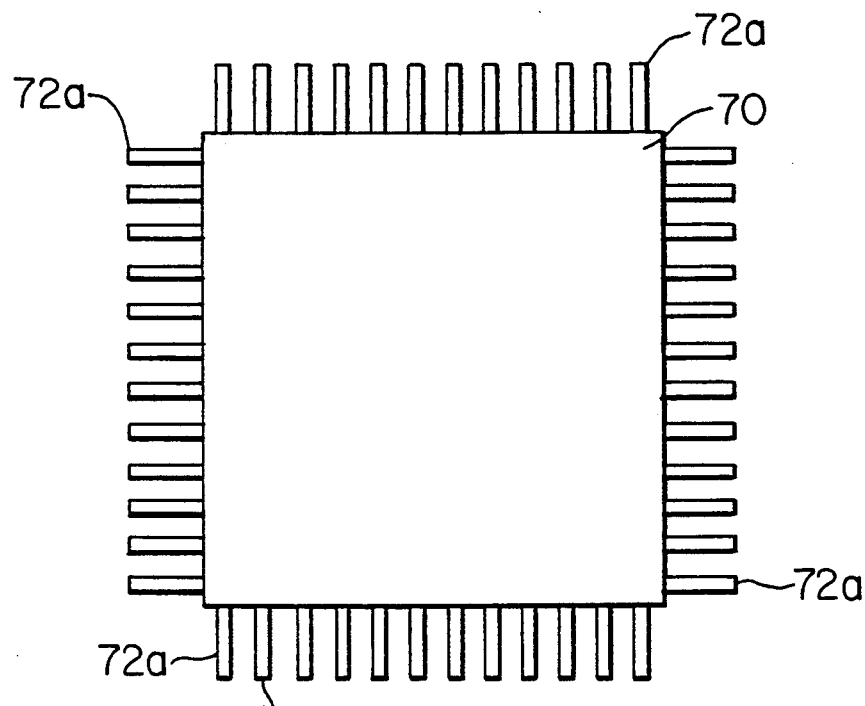
FIGS. 9(a) and 9(b) are a plan view and a partial side view of a QFP type semiconductor device in accordance with a third embodiment of the invention, respectively.
Figure 9B:
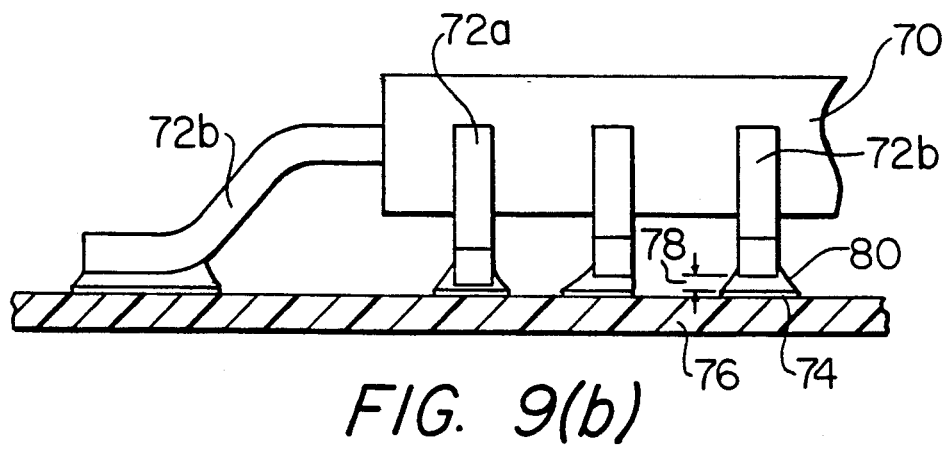

As shown in FIG. 9(a), a plurality of leads 72a and 72b extend out from the body of QFP type semiconductor device 70. Leads 72a and 72b are arrayed with a certain regularity. In other words, the four leads 72a which are positioned at one end portion of the array, are formed such that the length each of lead 72a is set to be much longer than the length of the other leads 72b. This is because longer leads 72a are mounted so as to extend much lower than shorter leads 72b against corresponding pad electrodes 74 on a circuit board 76, as shown in FIG. 9(b).

In the foregoing structure, QFP type semiconductor device 70 is stably supported on pad electrodes 74 by the four longer leads 72a of the edge portions and is placed at a determined position with respect to printed circuit board 76. A certain constant gap 78 (approximately several tens, e.g., 20 or 30, of $\mu m$) is formed between an edge of each shorter lead 72b and its respective pad electrode 74, in a manner similar to the second embodiment shown in FIGS. 8(a)-8(c). In the aforementioned surface mounting structure, gap 78 is fully filled with solder material 80, as shown in FIG. 9(b). Accordingly, even if a relative alignment error between an axial center of each lead 72b and its respective pad electrode 74 exists, a high lead pull strength of the soldered portion can be obtained by using a proper amount (e.g., an increased amount) of solder material 80.

In the above-described embodiments, including the modifications of such embodiments, the PGA type semiconductor device and the QFP type semiconductor device may comprise an LSI package. Also, in the foregoing embodiments and modifications, the longer leads could either be dummy leads, which are not electrically connected to the semiconductor chip provided in the package, or regular electrically connected leads. In this regard, a package and a semiconductor chip are usually manufactured separately and, after manufacture, the package and semiconductor chip are usually combined. However, the number of leads extending from the package is not always the same as the number of terminals of the chip. In such a case, the PGA or QFP type semiconductor device will have extra (i.e., unnecessary), leads. In accordance with the discussion above, these extra leads can be used as dummy leads in the foregoing embodiments for performing the function of the longer leads. Also, even if dummy leads are initially not existent in the package, it is possible to newly or intentionally design the package so as have dummy leads extending therefrom.

One or more dummy electrodes which, like the aforementioned dummy leads, do not perform an electrical function or act as part of an electric circuit on a circuit board, could also be formed on the circuit board to provide one or more additional mounting locations.

As described above, the present invention envisions the situation where longer leads and/or electrodes on the circuit board are not always electrically connected, but instead are mechanically connected.

In the second and third embodiments, as a worst case, the possibility exists that the function of the electric device may be affected if the gap between a longer lead and its respective electrode is not sufficiently filled with solder material, because an accurate alignment cannot be made. However, by using dummy leads, this potential problem can be essentially eliminated. That is, even if the dummy leads are not completely connected to respective electrodes, the function of the electric circuit of the semiconductor or electric device will not be affected by this fact.

Figure 10:
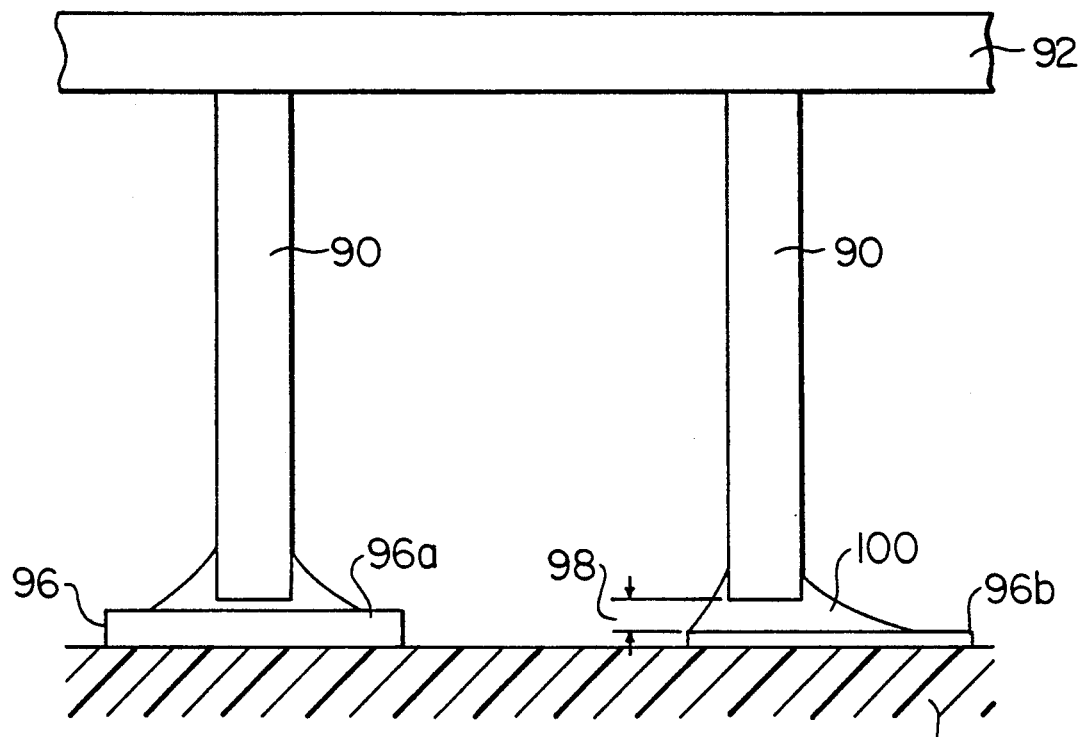
FIG. 10 is a partial side view of a PGA type semiconductor device in accordance with a fourth embodiment of the invention.

A fourth embodiment of the invention is explained with reference to FIG. 10, which is a partial side view of a PGA type semiconductor device 92 in accordance with a fourth embodiment of the invention. PGA type semiconductor device 92 has a plurality of leads 90 extending therefrom. A printed circuit board 94 has a plurality of corresponding pad electrodes 96 on its surface. In the fourth embodiment, each lead 90 is the same length, but pad electrodes 96 are of different thicknesses, depending on the positions of the pad electrodes. More particularly, pad electrodes 96a, which are provided at the four corners of circuit board 94, are several tens (e.g., 20 or 30) of μm thicker, in a direction perpendicular to the printed circuit board, than non-corner pad electrodes 96b. Accordingly, PGA type semiconductor device 92 is substantially supported by the pad electrodes 96a provided at the four corners. As a result, a gap 98 is formed between each non-corner pad electrode 96b and its respective lead 90.

Electrodes 96a and 96b are formed, for example, by providing electrodes that are thicker than usual on printed circuit board 94 and, thereafter, etching portions of each electrode 96b, which does not need to be thick, such each electrode 96b is etched to be thinner in dimension than any of electrodes 96a. Alternatively, electrodes 96a and 96b could be formed by providing electrodes of normal thickness on printed circuit board 94, and thereafter stacking or applying a further electrode or further electrode material on certain ones of the electrodes of normal thickness to form thicker electrodes 96a.

According to the aforementioned surface mounting structure, the gap 98 between each thinner pad electrode 96b an its respective lead 90 is fully filled with solder material 100. Accordingly, even if a relative alignment error between the center of a thinner pad electrode 96b and the center of its respective lead 90 exists, a proper amount (e.g., an increased amount) of solder material 100 may be supplied to obtain a higher lead pull strength.

Figure 11:
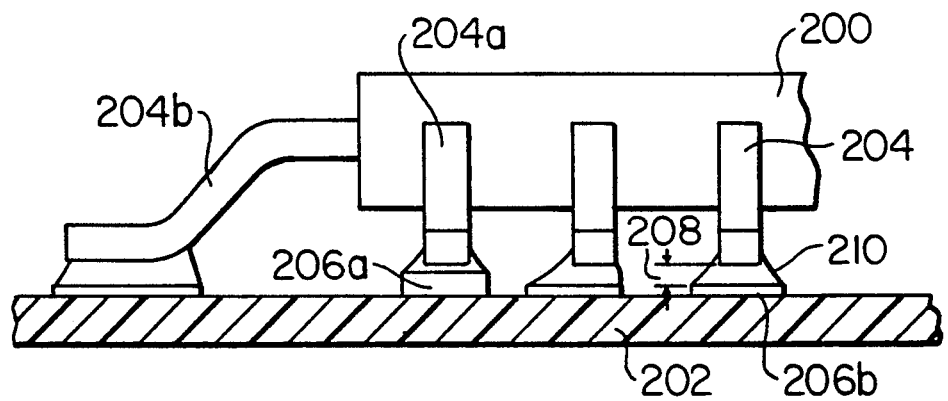
FIG. 11 is a partial side view of a QFP type semiconductor device in accordance with a fifth embodiment of the invention.

A fifth embodiment of the invention is described with reference to FIG. 11, which is a partial side view of a QFP type semiconductor device 200 that is soldered on a printed circuit board 202. In the fifth embodiment, a pad electrode 206a, which supports a corner lead 204a, is several tens of (e.g., 20 or 30 μm) thicker than that of the other pad electrodes 206b. Accordingly, QFP type semiconductor device 200 is substantially supported by pad electrodes 206a at the corner portions and a constant gap 208 is formed between each lead 204b and its respective pad electrode 206b.

In the aforementioned surface mounting structure, gap 208 is fully filled with solder material 210. Accordingly, even if there is a relative alignment error between the center of a thinner pad electrode 206b electrode and the center of its respective lead, a proper amount (e.g., an increased amount) of solder material 210 may be supplied between such elements to obtain a higher lead pull strength.

In the fourth and fifth embodiments of the printed circuit board in accordance with the present invention, each printed circuit board 94 and 202, in itself, is also an embodiment of the invention. Similar to the second and third embodiments, the leads which are supported by thick electrodes may be dummy leads which are not electrically connected, or electrical leads which are connected to a chip of a PGA or QFP type semiconductor device.

It is important to note that in the second to fifth embodiments, it is not necessary to place the longer leads at each of the four corners of the electric device. Similarly, in these embodiments, it is not necessary to place the thicker pad electrodes at each of the four corners of the printed circuit board. For example, three longer leads or three thicker pad electrodes, positioned at corner and/or non-corner locations, could be used to stably support a package or a semiconductor device. The positioning of the longer leads and thicker pad electrodes may be flexible.

Also, it is possible that a tool (not shown) can be used to stably support a package or a semiconductor device on the printed circuit board. For example, a spacer device, which very accurately spaces the package or semiconductor device in height from the printed circuit board, or a frame, which can position the package or the semiconductor device, may be used as the tool. When such a tool is used, the number of longer leads or thicker pad electrodes is not particularly limited. For example, if the tool is used to adjust the height between a lead and its respective pad electrode, neither a longer lead nor a thicker pad electrode is necessary.

A surface mounting procedure associated with use of the aforementioned tool is now described. First of all, after the tool is placed on the printed circuit board, the package or the semiconductor device is placed on (i.e., connected or attached to) the printed circuit board through the tool. After such placement, the tool provides a slight gap (e.g., several tens of μm, such as 20 or 30 μm), between each lead and its respective pad electrode, and each lead and its respective pad electrode are thereafter connected using an adhesive such as solder material.

After connection, the tool can be removed from the package or semiconductor device and the printed circuit board. However, the tool could also be left in place. For example, when the tool cannot be removed because of the surface mounting location, the tool may be left in place. In this case, by soldering the tool to the package and/or the printed circuit board, the lead pull strength can be improved even further.

As described above, according to the second to fifth embodiments, even if a relative alignment error occurs between the center of a lead and the center of its respective pad electrode, an electric device having an improved lead pull strength can be obtained. Furthermore, in accordance with the present invention, there is no need to carry out any special processing to form the leads, so that manufacturing productivity during formation of an electric device can be also improved. Also, the present invention provides an electric circuit device which meets the requirements for the miniaturization of pad electrodes and/or increases in the number of leads utilized.

Numerous modifications and variations of the present invention are possible in light of the above teachings. It is therefore to be understood that, within the scope of the appended claims, the present invention can be practiced in a manner other than as specifically described herein.

What is claimed is:

1. A circuit board for mounting an electric device having a plurality of leads, the circuit board comprising:
   an insulating substrate having a flat upper surface; and
   a pad electrode formed on the flat upper surface of the insulating substrate, the pad electrode including an upper portion and a lower portion, wherein the lower portion is configured to be bonded to a lead, each of the upper and lower portions comprises an upper surface facing upward away from the insulating substrate and a flat lower surface contacting the flat upper surface of the insulating substrate, and at least one of the upper surfaces is a linearly inclined sloped surface that inclines in the direction from the lower portion toward the upper portion.

2. The circuit board according to claim 1, wherein a lead is bonded to the pad electrode by a bonding material which fills a gap between the lower portion of the pad electrode and the lead.

3. The circuit board according to claim 1, wherein an end portion of a lead is bonded to the lower portion of the pad electrode.

4. The circuit board according to claim 1, wherein the flat upper surface of the pad electrode is sloped and the upper and lower portions comprise upper and lower portions on the slope of the pad electrode, respectively.

5. The circuit board according to claim 1, wherein the upper portion comprises a substantially horizontal plane and the lower portion comprises a sloped surface.

6. The circuit board according to claim 1, wherein an electric device is mounted on the circuit board, the electric device being one of a pin grid array type semiconductor device and a quad flat package type semiconductor device.

7. A circuit board, for mounting an electric device which comprises a package, a semiconductor device being provided in the package and a plurality of leads each having one end portion extending out from the package, the circuit board comprising:
   an insulating substrate having a flat upper surface; and
   a pad electrode formed on the flat upper surface of the insulating substrate and having a thinner portion and a thicker portion, wherein a portion of a lead contacts the thicker portion, thereby forming a gap, filled with bonding material, between the thinner portion of the pad electrode and one end portion of the lead, each of the thinner and thicker portions comprises an upper surface facing upward away from the insulating substrate and a flat lower surface contacting the flat upper surface of the insulating substrate, and at least one of the upper surfaces is a linearly inclined sloped surface that inclines in the direction from the thinner portion toward the thicker portion.

8. The circuit board according to claim 7, wherein an electric device is mounted on the circuit board, the electric device being one of a pin grid array type semiconductor device and a quad flat package type semiconductor device.

9. A circuit board, for mounting an electric device which comprises a package, a semiconductor chip being provided in the package, and a plurality of leads each having one end portion extending out from the package, the circuit board comprising:
   an insulating substrate; and
   a plurality of pad electrodes formed on a same side of the insulating substrate, the plurality of pad electrodes including at least one thinner pad electrode and at least one thicker pad electrode, at least one lead being mounted on a corresponding thinner electrode among the plurality of pad electrodes to thereby form a gap, filled with solder, between the lead and the corresponding thinner electrode.

10. The circuit board according to claim 9, wherein an electric device is mounted on the circuit board, the electric device being one of a pin grid array type semiconductor device and a quad flat package type semiconductor device.

11. The circuit board according to claim 11, wherein at least three thicker pad electrodes and at least one thinner pad electrode are formed on the insulating substrate, and a bonding material fills the gap formed between the thinner pad electrode and one end of the lead.

12. The circuit board according to claim 9, further comprising a support tool for holding a package and providing a gap between one of the pad electrodes and one end of a corresponding lead.

13. An electric device mounted on a circuit board which has a plurality of pad electrodes each having a surface contacting a same side of the circuit board, the plurality of pad electrodes including at least one thinner pad electrode and at least one thicker pad electrode, and the electric device comprising:
   a packaging including a semiconductor device; and
   a plurality of leads, at least three of the leads being longer than other ones of the leads, each of the longer leads having one end portion which is bonded to a corresponding thinner pad electrode among the plurality of pad electrodes, each of the other leads having one end portion which is bonded to a corresponding thicker pad electrode among the plurality of pad electrodes, and a bonding material filling a gap formed between each of the other leads and its corresponding thicker pad electrode.

14. The electric device according to claim 13, wherein the package is one of a pin grid array type semiconductor device and a quad flat package type semiconductor device.

15. A circuit board for mounting an electric device having a plurality of leads, the circuit board comprising:
   an insulating substrate; and
   a pad electrode formed on the insulating substrate, the pad electrode including an upper portion and a lower portion, wherein the lower portion is configured to be bonded to a lead, and wherein the lower and upper portions comprise sloped planes, and the slope of the lower portion is greater than the slope of the upper portion.

16. An electric device mounted on a circuit board which has a plurality of pad electrodes each having a surface contacting the circuit board, the electric device comprising:
   a package including a semiconductor device; and
   a plurality of leads, each having one end portion which is bonded to a corresponding pad electrode among the plurality of pad electrodes, at least three of the leads being longer than other ones of the leads, and a bonding material filling a gap formed between each of the other leads and its corresponding pad electrode, wherein the three leads and the pad electrodes corresponding to the three leads are, respectively, dummy leads and dummy pad electrodes that are electrically unconnected.

17. A circuit board for mounting an electric device having a plurality of leads, the circuit board comprising:
an insulating substrate having a flat upper surface;
a pad electrode formed on the flat upper surface of the insulating substrate, the pad electrode including an upper portion and a lower portion, wherein the lower portion is configured to be bonded to a lead having an end portion, each of the upper and lower portions comprises an upper surface facing upward away from the insulating substrate and a flat lower surface contacting the flat upper surface of the insulating substrate, and at least one of the upper surfaces is a linearly inclined sloped surface that inclines in the direction from the lower portion toward the upper portion; and
a lead having an end portion that is bonded to the lower portion of the pad electrode.

18. A circuit board for mounting an electric device having at least one lead, the circuit board comprising:
an insulating substrate having a flat upper surface; and
a stepped slope pad electrode formed on said flat upper surface of the insulating substrate, said pad electrode including an upper portion, a lower portion, and an intermediate portion located between said upper and lower portions, wherein each of said upper, lower, and intermediate portions comprises an upper surface facing upward away from said insulating substrate and a flat lower surface contacting the flat upper surface of the insulating substrate, and at least one of said upper surfaces is a sloped surface.

19. The circuit board according to claim 18, wherein said upper surface of said intermediate portion is a sloped surface.

20. An electric device mounted on a circuit board, wherein:
said electric device comprises a package and at least one lead extending out from said package;
said at least one lead comprises a first portion and a second portion located between said first portion and said package;
said circuit board comprises an insulating substrate and a pad electrode formed on said insulating substrate, said pad electrode including a thinner portion and a thicker portion, said thicker portion and said thinner portion each having an upper surface, and said upper surface of said thicker portion being located further away from said insulating substrate than said upper surface of said thinner portion;
a lower surface of said second portion of said at least one lead and said upper surface of said thicker portion of said pad electrode contact each other to form a gap between a lower surface of said first portion of said at least one lead and said upper surface of said thinner portion of said pad electrode; and
bonding material is disposed within the gap formed between said lower surface of said first portion of said at least one lead and said upper surface of said thinner portion of said pad electrode.

21. The electric device according to claim 20, wherein the gap between said lower surface of said first portion of said at least one lead and said upper surface of said thinner portion of said pad electrode is filled with said bonding material.

22. The electric device according to claim 20, wherein bonding material is disposed between said at least one lead and said pad electrode at a position closer to said package than said second portion.

23. The electric device according to claim 20, wherein said electric device comprises a semiconductor device provided in said package.

24. An electric device mounted on a circuit board, wherein:
said circuit board comprises an insulating substrate and a plurality of pad electrodes formed on said insulating substrate;
said electric device includes a package disposed above said circuit board and a plurality of leads extending from a lower surface of said package toward an upper surface of said circuit board;
said plurality of leads includes at least one shorter lead and at least one longer lead, said at least one longer lead contacting a first corresponding one of said pad electrodes, and said at least one shorter lead terminating at a position above a second corresponding one of said pad electrodes to form a gap between said at least one shorter lead and said second corresponding one of said pad electrodes; and
bonding material is disposed within the gap between said at least one shorter lead and said second corresponding one of said pad electrodes.

25. The electric device according to claim 24, wherein the gap between said at least one shorter lead and said second corresponding one of said pad electrodes is filled with said bonding material.

26. The electric device according to claim 24, wherein said electric device comprises a semiconductor device.

27. The electric device according to claim 26, wherein said semiconductor device comprises a pin grid array (PGA) type semiconductor device.

* * * * *

UNITED STATES PATENT AND TRADEMARK OFFICE
CERTIFICATE OF CORRECTION

PATENT NO. : 5,291,375
DATED : March 01, 1994
INVENTOR(S) : Minoru MUKAI

It is certified that error appears in the above-indentified patent and that said Letters Patent is hereby corrected as shown below:

Claim 11, column 12, line 20, change "claim 11" to --claim 9--.

Signed and Sealed this

Fourth Day of October, 1994

Attest:

Attesting Officer

BRUCE LEHMAN

Commissioner of Patents and Trademarks